United States Patent [19]

Yearsley

[11] Patent Number: 4,896,418
[45] Date of Patent: Jan. 30, 1990

[54] DIRECT MOUNTING METHOD FOR SEMICONDUCTORS

[75] Inventor: Gerald A. Yearsley, Singapore, Singapore

[73] Assignee: Texas Instrument Incorporated, Dallas, Tex.

[21] Appl. No.: 83,759

[22] Filed: Aug. 7, 1987

[51] Int. Cl.⁴ .............................................. H05K 3/34
[52] U.S. Cl. ....................................... 29/827; 29/833; 29/720; 29/740
[58] Field of Search ................. 29/827, 832, 833, 840, 29/720, 740

[56] References Cited

U.S. PATENT DOCUMENTS 4,667,402  5/1987  Wilde ................................... 29/840
4,797,994  1/1989  Michaud et al. ...................... 29/240

Primary Examiner—Timothy V. Eley
Attorney, Agent, or Firm—B. Peter Barndt; James T. Comfort; Melvin Sharp

[57] ABSTRACT

A method for placing reverse mounted semiconductor bars on a lead frame wherein the semiconductor bar is placed in the target area and accurately position by an alignment system including a video camera which views the semiconductor bar, through a transparent stage for positioning the bar for mounting, during the time of placement of the bar, and optionally a second video camera is used to monitor the position of the lead frame during mounting.

27 Claims, 2 Drawing Sheets

DIRECT MOUNTING METHOD FOR SEMICONDUCTORS

This invention relates to semiconductors and more particularly to a method for accurately mounting semiconductor bars on lead frames.

BACKGROUND OF THE INVENTION

Automated placement of semiconductor bars on lead frames is presently accomplished using pick-and-placement mechanisms. This method may be briefly described as follows. A semiconductor bar is indexed to a known location, often through the use of a video camera alignment system. The semiconductor bar is then pushed of from a slice holder by a 'Z' stage operated from beneath the slice. A semiconductor bar is captured by a pick-up tip and held there by a vacuum and is removed from the slice holder. The 'Z' stage is them withdrawn leaving the semiconductor bar firmly held to the pick-up tip by the vacuum.

The pick-up tip and related mechanism is rotated up to 180 degrees and positioned above the area on a lead frame to which the semiconductor bar is to be mounted. After a mechanical settle-time, the pick-up tip is lowered to place the semiconductor bar in contact with the pad area of the lead frame. The vacuum is released and the semiconductor bar adheres to the bar pad area. The pick-up tip is then withdrawn for another cycle.

The pick and place method is a blind placement method. Once the semiconductor bar is secured to the tip of the pick-up time. The tip is rotated and the semiconductor bar is place on the lead frame, the accuracy of the placement depends upon the alignment of the pick-up tip with the indexed position of the lead frame.

The though put of such systems is in the range of 1000 to 3000 semiconductor bars mounted per hour. Systems are designed such that bar movement and slick-to-lead frame tolerances are minimized by careful set-up and good mechanical stability. However, as semiconductors slices become larger, the radius of the pick-and-place mechanism must increase requiring greater accuracy.

SUMMARY OF THE INVENTION

The present invention eliminates the need for pickup and placement of the semiconductor bar as the bar is moved directly from the slice holder and moved directly to the lead frame. The bar is positioned directly over the target area of the lead frame and is then lowered into place while a video camera/alignment system monitors the progress and makes any necessary corrections in the alignment. The semiconductor bar is maintained in constant view of the alignment system at all times during the mounting cycle.

The semiconductor slice is mounted face down on the slice holder in contact with a plastic film. The slice is then sawed to separate the semiconductor bars prior to mounting.

A semiconductor bar is then aligned over the target area of a lead frame, or when the system is so designed, several bars may be aligned over an array of lead frames. For example, a lead frame matrix of a single row or multiple rows of lead frames may be positioned so that several bars may be mounted at one time.

After the semiconductor bar has been aligned over the lead frame mounting area, a "Z" stage is lowered to move the semiconductor bar into engagement with the lead frame mounting area. Because the plastic film on which the semiconductor slice is mounted is flexible, the engagement of the plastic film over the semiconductor bar by the "Z" stage will permit the semiconductor bar to be moved downward into engagement with the mounting area of the lead frame while the semiconductor bar is still attached to the plastic film.

The back side of each semiconductor bar is coated with an epoxy mounting material so that when the semiconductor bar engages the mounting surface of the lead frame, the semiconductor bar will adhere to the mounting surface. By applying the epoxy to the backside of the bar, the necessity of applying the epoxy to the lead frame before mounting enhances the accuracy of epoxy placement.

To further improve the accuracy of the invention, multiple "Z" stages may be provided. The multiple "Z" stages are closely spaced so to avoid unnecessary movement of the lead frame. Each "Z" stage may be equipped with its own alignmet camera. The "Z" stages are transparent so that each alignment camera looks through the "Z" stage aligning the "Z" stage with the semiconductor bar before the "Z" stage is lowered to move the semiconductor into engagement with the mounting surface of the lead frame.

As an alternate method to the lowering the "Z" stage into contact with the plastic film to which the semiconductor is mounted, the "Z" stage may be hollow and a short blast of air may be used to force the flexible plastic film and the semiconductor bar into engagement with the mounting surface of the lead frame.

An optional second video camera/alignment system may be used to look up from under the lead frae to ensure that the lead frame has been correctly indexed into position.

The present invention increases the accuracy and speed of mounting semiconductor bars on lead frames. The technical advance represented by the invention as well as other objects and advantages will be apparent from the following description of an example of the invention when considered in conjunction with the accompanying drawings, and the novel features set forth in the claims.

DESCRIPTION OF A PREFERRED EMBODIMENT OF THE INVENTION

Figure 1:
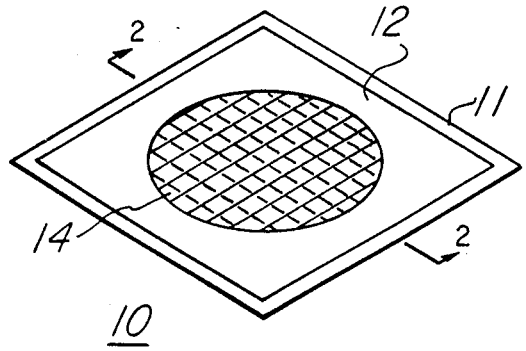
FIG. 1 illustrates a mounted semiconductor slice that has been cut into semiconductor bars that are to be mounted according to the present invention.

FIG. 1 illustrates a semiconductor slice mounted in a slice carrier.

Slice 14 is mounted face down on a plastic film 12 and then is cut into individual semiconductor bars 13. The exposed back side of each semiconductor bar is coated with an epoxy (not illustrated) to adhere the semiconductor bar to a lead frame discussed below.

Figure 2:
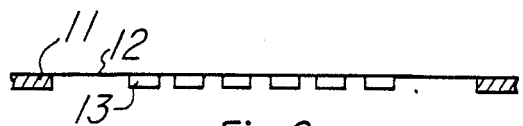
FIG. 2 is a cross sectional view of the mounted semiconductor slice illustrated in FIG. 1.

FIG. 2 is a cross sectional view of the mounted slice, section 2—2 taken through the center of the slice along one of the cut lines that has cut the slice into individual semiconductor bars. A plastic film 12 is mounted in a slice carrier frame 11 and then the semiconductor slice is mounted with the face of the slice against the plastic film leaving the mounting surface of each individual semiconductor bar exposed and ready for mounting. The mounting surface of each semiconductor bar is coated with an epoxy to adhere the bar to a lead frame.

Figure 3:
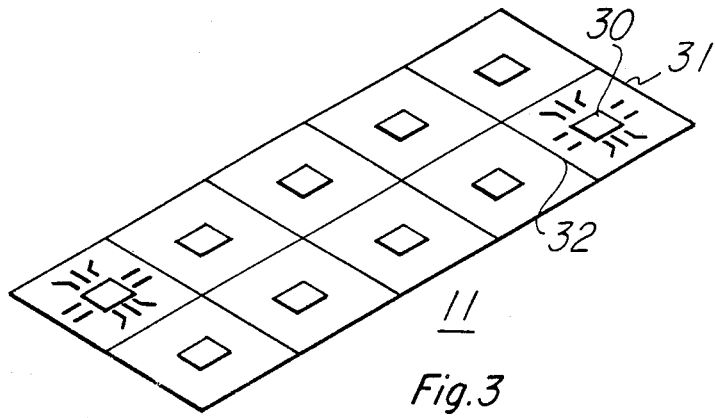
FIG. 3 illustrates a two row lead frame matrix to which semiconductor bars are to be mounted.

FIG. 3 illustrates a two by five lead frame array. The invention is not dependent upon the size of the array and the array illustrated in FIG. 3 is for illustration purposes only.

The arrayy consists of two columns of arrays, five lead frames long. Individual lead frames may be used or, in some instances a continuous strip of lead frames may be used. Each lead frame basically consists of a semiconductor bar mounting suurface 30, a plurality of leads 32 temporarily attached to the mounting base and to a frame 31. After the semiconductor bar has been attached to the lead frame mounting area 30, the semiconductor is appropriately connected to the leads 32, after which the leads are detached or cut away from the mounting base 30 and frame 31.

Figure 4:
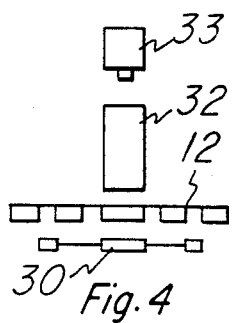
FIG. 4 illustrates a basic concept of the invention prior to the mounting of a semiconductor bar.

The basic concept of the invention is illustrated in FIG. 4. Illustrated is the lead frame 31 and the semiconductor bar mounting surface 30 positioned under a semiconductor bar 13. The bar is attached to the plastic film 12 and is mounted so that the mounting surface of the semiconductor bar is positioned over and adjacent the mounting surface 30 of the lead frame. Other semiconductor bars are adjacent to the bar to be mounted, and have previously been separated from each other by sawing the semiconductor slice.

The semiconductor bar is positioned over the mounting surface of the lead frame by the alignment system by accurately positioning the semiconductor bar under the "Z" stage 32. "Z" stage 32 is transparent thereby permitting the semiconductor bar 13 to be viewed by the alignment system 33. The alignment system views the semiconductor bar 13 through the transparet "Z" stage and aligns the bar with the "Z" stage.

Figure 5:
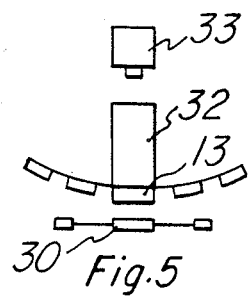
FIG. 5 illustrates the mounting of semiconductor bar to a lead frame.

The actual mounting of the semiconductor bar 13 is illustrated in FIG. 5. After the semiconductor bar 13 has been aligned with the "Z" stage, the "Z" stage is lowered, contacting the plastic film 12 over the semiconductor bar 13. The "Z" stage is then continued to be lowered until the plastic film is stretched and the semiconductor bar 13 is pushed into engagement with the mounting surface 30 of the lead frame.

The "Z" stage is then raised, but the semiconductor bar 13 adheres to the mounting surface 30 of the lead frame because of the epoxy previously applied to the mounting surface of the semiconductor bar 13.

An alternate method of engaging the semiconductor bar and the lead frame other than lowering the "Z" stage is to have a hollow "Z" stage and to introduce a short pulse of air into and along the hollow center of the "Z" stage. The pulse of air directed at the plastic film over the semiconductor bar to be mounted will force the semiconductor bar into engagement with the mounting surface of lead frame. This method may be preferably in some instances where the pressure of the "Z" stage against the active surface of the semiconductor bar may cause damage thereto.

The stretching of the plastic film in Figure is exaggerated somewhat. The mounting surface of the semiconductor bar 13 and the mounting surface of lead frame 30 are close together and only a small amount of "push" by the "Z" stage is need to bring the semiconductor bar 13 and lead frame mounting surface 30 into contact.

The flexing of the plastic film does not disengage semiconductor bard adjacent to the one being mounted. After a semicondictor bar has been mounted, a new lead frame and another semiconductor bar are aligned and the mounting process by the "Z" stage is repeated.

Figure 6:
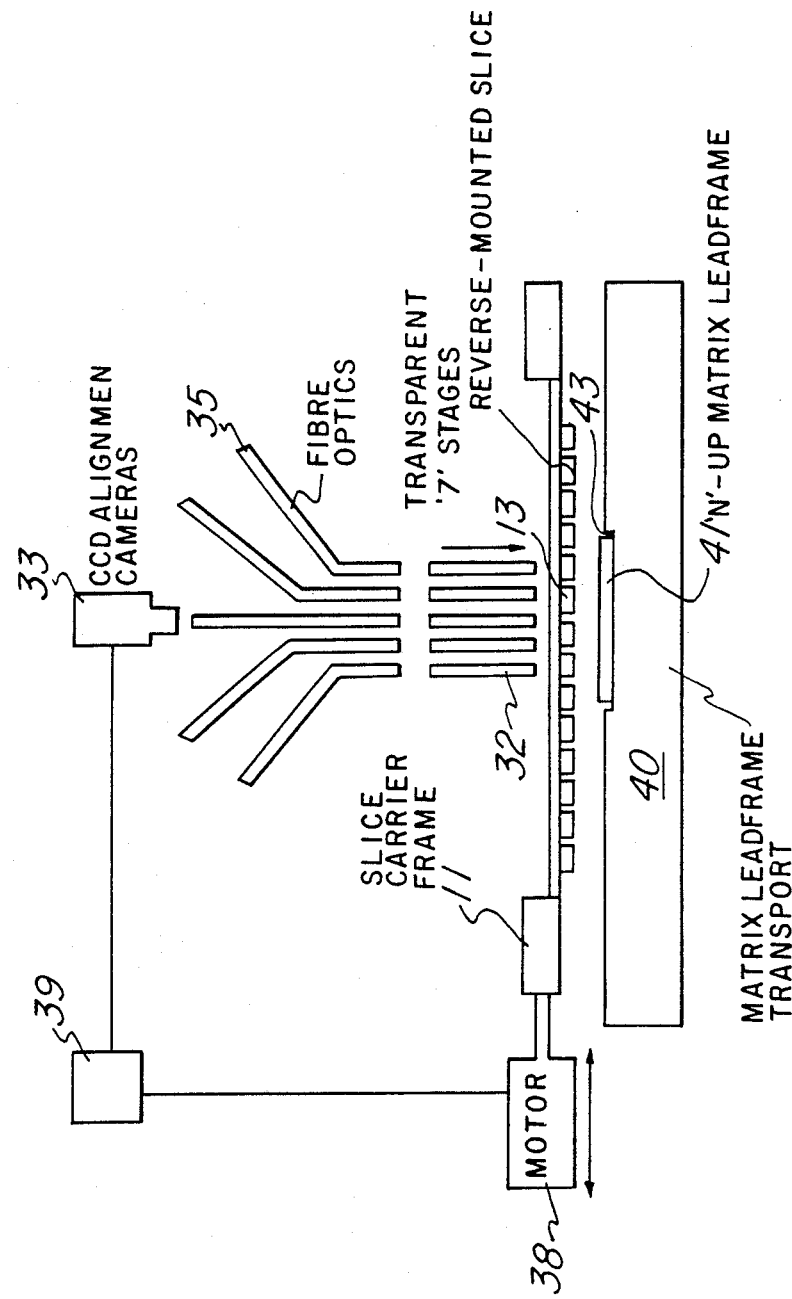
FIG. 6 illustrates an overall view of the concept of the invention.

FIG. 6 illustrates the overall concept of the present invention. A lead frame matrix transport 40 is used to move lead frames to the mounting position under a semiconductor bar 13 that is to be mounded on the lead frame. The transport may provide linear movement for positioning a continuous strip of lead frames, or may include an X-Y drive to provide two dimensional positioning capability. The lead frames are mounted in a track 43 to hold the lead frame in a fixed position while the transport provides the positioning movement. A semiconductor slice that has been reverse mounted and cut to separate the individual semiconductor bar is held in a slice carrier frame 11. The carrier frame is positioned by a motor drive 38 to align an individual semiconductor bar over a lead frame.

To position an individual semiconductor bar, an alignment camera 33 views a semiconductor bar through a fibre optic 35 and a transparent "Z" stage 32. In order to limited the movement needed to align a semiconductor bar, a plurality of "Z" stages 32, fibre optics 35 and several alignment cameras may be used.

Logical information is fed from the alignment camera 33 to a logical control unit 39. The position information from the logical control unit 39 is used to drive and position motor unit 38. As motor drive unit 38 moves, the slice carrier and the individual semiconductor bars thereon move, the movement is relayed to the drive unit though the alignment camera, and the control unit 39 to accurately position the semiconcuctor over the mounting surface of the lead frame. The lead frame is indexed to a fixed and known position and a semiconductor bar is positioned over the fixed and known position. Thereafter the semiconductor bar is lowered via the "Z" stage into engagement with the mounting surface of the lead frame.

What is claimed:

1. A method for directly mounting a semiconductor bar upon a mounting area of a leadframe, comprising the steps:
   (a) adhering semiconductor bars to a film;
   (b) viewing the mounting area through a transparent "Z" stage; and
   (c) using the "Z" stage to apply a force to the semiconductor bar to bring the semiconductor bar into contact with the mounting area.

2. The method according to claim 1, wherein step (a) includes the step of:
   adhering the active face of the semiconductor bar to the film.

3. The method according to claim 1, wherein:
   step (b) viewing is carried out using a camera.

4. The method according to claim 1, wherein step (c) includes the step of:
   moving the "Z" stage in a direction toward the mounting area of the leadframe to bring the semiconductor bar into contact with the mounting area.

5. The method according to claim 1, wherein step (c) includes the step of:

passing a short pulse of gas through the "Z" stage, in a direction toward the mounting area to bring the semiconductor bar into contact with the mounting area.

6. The method according to claim 1, wherein step (c) includes the step of:
bringing the back-side of the semiconductor bar into contact with the mounting area.

7. A direct mount system for removing a semiconductor bar from a semiconductor slice, that has been sawed to separate the slice into a plurality of semiconductor bars, to a leadframe having a semiconductor bar mounting area thereon, the semiconductor slice being mounted on and adhered to a plastic film in a slice carrier, the direct mount system comprising a leadframe transport, a movable slice carrier frame, a vertical engaging rod engaging and moving a semiconductor bar, and a video-optical alignment system, said movable slice carrier frame having said semiconductor slice mounted on said plastic film positioned thereon above the leadframe transport and a leadframe thereon, said video-optical alignment system aligning the semiconductor bar over the bar mounting area on said leadframe, and said vertical engaging rod engaging and moving a semiconductor bar in a direction perpendicular to the semiconductor and pressing downward on the semiconuuctor bar, flexing the plastic film to push the semiconductor bar into engagement with the mounting area on the leadframe; wherein the vertical engaging rod for engaging the semiconductor bar is transparent and the video/optical alignment system views the semiconductor through the transparent vertical engaging rods during alignment of the semiconductor with the leadframe mounting area.

8. A direct mount system for removing a semiconductor bar from a semiconductor slice, that has been sawed to separate the slice into a plurality of semiconductor bars, to a leadframe having a semiconductor bar mounting area thereon, the semiconductor slice being mounted on and adhered to a plastic film in a slice carrier, the direct mount system comprising a leadframe transport, a movable slice carrier frame, a vertical engaging rod engaging and moving a semiconductor bar, and a vedio/optical alignment system, said movable slice carrier frame having said semiconductor slice mounted on said plastic film positioned thereon above the leadframe transport and a leadframe thereon, said video/optical alignment system aligning the semiconductor bar over the bar mounting area on said leadframe, and said vertical engaging rod engaging and moving a semiconductor bar in a direction perpendicular to the semiconductor and pressing downward on the semiconductor bar, flexing the plastic film to push the semiconductor bar into engagement with the mounting area on the leadframe; wherein the semiconductor slice is mounted with the active surface of the semiconductor slice adjacent to the plastic film so that the mounting surface of each semiconductor bar is adjacent the mounting area of each leadframe when the vertical engaging rod transfers the semiconductor bar from the plastic film to the leadframe mounting area.

9. A direct mount system for removing a semiconductor bar from a semiconductor slice, that has been sawed to separate the slice into a plurality of semiconductor bars, to a leadframe having a semiconductor bar mounting area thereon, the semiconductor slice being mounted on and adhered to a plastic film in a slice carrier, the direct mount system comprising a leadframe transport, a movable slice carrier frame, a vertical engaging rod engaging and moving a semiconductor bar, and a video/optical alignment system, said movable slice carrier frame having a semiconductor slice mounted on plastic film positioned thereon above the leadframe transport and a leadframe thereon, said video/optical alignment system aligning the semiconductor bar over the bar mounting area on said leadframe, and said vertical engaging rod engaging and moving a semiconductor bar moving in a direction perpendicular to the semiconductor and pressing downward on the semiconductor bar, flexing the plastic film to push the semiconductor bar into engagement with the mounting area on the leadframe; including a second video/optical system which is used to index the lead frame to a location beneath the semiconductor bar to which it is to be attached.

10. A direct mount system for removing a semiconductor bar from a semiconductor slice, that has been sawed to separate the slice into a pluralityy of semiconductor bars, to a leadframe having a semiconductor bar mounting area thereon, the semiconductor slice being mounted on and adhered to a plastic film in a slice carrier, the direct mount system comprising a leadframe transport, a movable slice carrier frame, a vertical engaging rod engaging and moving a semiconductor bar, and a video/optical alignment system, said movable slice carrier frame having a semiconductor slice mounted on plastic film positioned thereon above the leadframe transport and a leadframe thereon, said video/optical alignment system aligning the semiconductor bar over the bar mounting area on said leadframe, and said vertical engaging rod engaging and moving a semiconductor bar moving in a direction perpendicular to the semiconductor and pressing downward on the semiconductor bar, flexing the plastic film to push the semiconductor bar into engagemnt with the mounting area on the leadframe; wherein the video/optical alignment system includes a transparent rod along an axis for engaging and moving said semiconductor bar, a fiber optics having an axis along a line common to the axis of said engaging and moving rod, a video camera for viewing a semiconductor bar through said fiber optics and said transparent rod for engaging said semiconductor, and a control logic system for receiving error signals indicative of misalignment of said semiconductor bar and for controlling said movable slice carrier frame.

11. A direct mount system for removing a semiconductor bar from a semiconductor slice, that has been sawed to separate the slice into a plurality of semiconductor bars, to a leadframe having a semiconductor bar mounting area thereon, the semiconductor slice being mounted on and adhered to a plastic film in a slice carrier, the direct mount system comprising a leadframe transport, a movable slice carrier frame, a vertical engaging rod engaging and moving a semiconductor bar, and a video/optical alignment system, said movable slice carrier frame having a semiconductor slice mounted on plastic film positioned thereon above the leadframe transport and a leadframe thereon, said video/optical alignment system aligning the semiconductor bar over the bar mounting area on said leadframe, and said vertical engaging rod engaging and moving a semiconductor bar moving in a direction perpendicular to the semiconductor and pressing downward on the semiconductor bar, flexing the plastic film to push the semiconductor bar into engagement with the mounting area on the leadframe; wherein said vertical engaging rod for engaging and moving a semiconductor bar is hollow and that the plastic film on which the semiconductor bar is mounted is flexed and the semiconductor bar is moved into engagement with the mounting area on the leadframe by directing a pulse of air through the hollow means for engaging and moving a semiconductor bar.

12. A direct mount system for removing a semiconductor bar from a semiconductor slice, that has been sawed to separate the slice into a plurality of semiconductors bars, to a leadframe having a semiconductor bar mounting area thereon, the semiconductor slice being mounted on and adhered to a plastic film in a slice carrier, comprising a system for aligning the semiconductor bar with the mounting area on said leadframe and means aiding said system for aligning the semiconductor bar with the mounting area on said leadframe, for applying a force to the plane of said plastic film to flex said film and semiconductor bar in a direction toward the mounting area on the lead frame to bring the semiconductor bar into contact with said mounting area; wherein the means for applying force to said plastic film is a transparent rod movable in a direction normal to the plane of said plastic film.

13. A direct mount system for removing a semiconductor bar from a semiconductor slice, that has been sawed to separate the slice into a plurality of semiconductor bars, to a leadframe having a semiconductor bar mounting area thereon, the semiconductor slice being mounted on and adhered to a plastic film in a slice carrier, comprising a system for aligning the semiconductor bar with the mounting area on said leadframe and second means for applying a force to the plane of said plastic film to flex said film and semiconductor bar in a direction toward the mounting area on the leadframe to bring the semiconductor bar into contact with said mounting area; wherein the video/optical alignment system inlcudes a transparent rod along an axis for engaging and moving said semiconductor bar, a fiber optics having an axis along a line common to the axis of said transparent rod, a video camera for viewing a semiconductor bar through said fiber optics and said transparet rod, and a control logic for receiving error signals indicative of misalignment of said semiconductor bar and for controlling said movable slice carrier frame.

14. The system according to claim 13 wherein there are multiple video/optical alignment systems closely spaced to minimized movement of the slice carrier frame to align a semiconductor bar.

15. A system for directly mounting a semiconductor bar upon a mounting area of a leadframe, comprising:
a film upon which the semiconductor bar is adhered;
transparent means for applying a force to the semiconductor bar in a direction toward the mounting area on the leadframe to bring the semiconductor bar into contact with the mounting area, and for viewing the mounting area through the transparent means.

16. The system according to claim 15, further comprising:
means for aligning the semiconductor bar with the mounting area.

17. The system according to claim 16, wherein the aligning means inlcudes:
camera means for looking through the transparent means, for viewing the mounting area.

18. The system according to claim 15, wherein the film comprises:
flexible plastic.

19. The system according to claim 15, wherein:
the transparent means is movable in a direction toward the mounting area to bring the semiconductor bar into contact with the mounting area.

20. The system according to claim 15, wherein:
the transparent means is hollow for passing a short pulse of gas in a direction toward the mounting area to bring the semiconductor bar into contact with the mounting area.

21. The system according to claim 15, wherein:
the semiconductor bar is adhered to the film by the active face of the bar.

22. A system for directly mounting a semiconductor bar upon a mounting area of a leadframe, comprising:
a film upon which the active face of a semiconductor bar is adhered;
adhesive means on the back-side of the semiconductor bar; and
force means for applying a force to the semiconductor bar to bring the adhesive means on the back-side of the semiconductor bar into contact with the mounting area of a leadframe.

23. The system according to claim 22; wherein:
the film is a flexible plastic film.

24. The system according to claim 22, wherein:
the adhesive means is an epoxy mounting material.

25. The system according to claim 22, wherein:
the force means is transparent.

26. The system according to claim 22, wherein:
the force means is movable in a direction toward the mounting area on the leadframe for bringing the semiconductor bar into contact with the mounting area.

27. The system according to claim 22, wherein:
the force means is hollow for passing a short pulse of gas in a direction toward the mounting area to bring the semiconductor bar into contact with the mounting area.

* * * * *